United States Patent [19]
Paillardet et al.

[11] Patent Number: 5,684,485
[45] Date of Patent: Nov. 4, 1997

[54] MULTI-COMPARISON ANALOG-TO-DIGITAL CONVERTERS USING THE INTERPOLATION PRINCIPLE

[75] Inventors: Frédéric Paillardet, Grenoble; Francis Dell'ova, St. Hilaire du Touvet, both of France

[73] Assignee: Thomson Multimedia S.A., Courbevoie, France

[21] Appl. No.: 503,908

[22] Filed: Jul. 18, 1995

[30] Foreign Application Priority Data

Jul. 18, 1994 [FR] France .................... 94 08958

[51] Int. Cl.$^6$ .................... H03M 1/36
[52] U.S. Cl. .................... 341/159; 341/122; 341/136
[58] Field of Search .................... 341/158, 159, 341/136, 122; 327/77

[56] References Cited

U.S. PATENT DOCUMENTS

| | | | |
|---|---|---|---|
| 4,989,003 | 1/1991 | Sauer | 341/136 |
| 5,302,869 | 4/1994 | Hosotani et al. | 307/518 |
| 5,465,093 | 11/1995 | Kusumoto et al. | 341/122 |

FOREIGN PATENT DOCUMENTS

| | | |
|---|---|---|
| A404476 | 12/1990 | European Pat. Off. . |
| A0591868 | 4/1994 | European Pat. Off. . |

OTHER PUBLICATIONS

Proceedings of the IEEE 1992 Integrated Circuits Conference, May 1992 New York, NY pp. 16.8.1–16.8.4 K.J. McCall et al. "A 6–bit 125 MHz CMOS A/D Converter".
IEEE 1993 WP4.3:A 106 20MHz 39m W Pipelined Interpolating CMOS ADC, K. Kusmoto, K. Murata, A. Matsuzawa, S. Tada, M. Maruyama, K. Oka, H. Konishi, Matsushita Electric Industrial Co. Ltd./Matsushita Electronics Corp., Osaka, Japan.

*Primary Examiner*—Todd E. DeBoer
*Attorney, Agent, or Firm*—Joseph S. Tripoli; Frederick A. Wein; Shabtay S. Henig

[57] ABSTRACT

The disclosure concerns a so-called "auto-zeroing" comparator of two analog input voltages to be compared, and an analog-to-digital converter using a set of auto-zeroing comparators enabling the number of comparators required for an analog-to-digital conversion to be reduced. The main originality of the invention is that this comparator includes a second stage constituted by an inverter function provided in such a way that only a first transistor is controlled on its gate by the previous stage, a second transistor having its gate and drain short-circuited by a switch during the auto-zeroing phase, and a third transistor used as a capacitor and connected to the gate of said second transistor and also to the supply voltage. The present invention is applicable in particular to all types of CMOS multi-comparison ADCs using at least one "auto-zeroing" comparator.

5 Claims, 4 Drawing Sheets

MULTI-COMPARISON ANALOG-TO-DIGITAL CONVERTERS USING THE INTERPOLATION PRINCIPLE

BACKGROUND OF THE INVENTION

The present invention relates to a so-called "auto-zeroing" voltage comparator, and an analog-to-digital converter (ADC) using a set of so-called "auto-zeroing" comparators, enabling the number of comparators necessary for an analog-to-digital conversion to be reduced.

The document "A 6 bits 125 MHz CMOS A/D Converter" by Kevin J. McCall (IEEE 1992 Custom Integrated Circuits Conference, 16.8.1) describes a flash-type ADC. An improvement to this type of flash converter is possible by application of the principle of interpolation, illustrated in FIG. 1. Compared with a classical flash converter comprising a number of comparators, this improvement consists in eliminating by capacitive coupling half of one out of every two comparators, thereby reducing both the size and the power consumption.

For reasons of clarity, the items of figures having the same function carry the same reference number in each of the figures. Moreover, in the description below we will limit ourselves to a restricted number of reference voltages Vrefi, Vrefj, Vrefk and Vrefl; the explanations given can, of course, be extended to a converter with n inputs.

In FIG. 1, the resistances in series Ri, Rj, Rk, etc. supply the reference voltages Vrefi, Vrefj, Vrefk, etc. that are respectively those of the nodes i, j, k, l, etc. Only every other one of these reference voltages are taken into account, i.e. in a series Vrefi, Vrefj, Vrefk and Vrefl, only the voltages Vrefi and Vrefk will be connected directly to the voltage comparator circuits. In FIG. 1, the reference voltages Vrefi and Vrefk are connected to the node 1 via the switches 3, the voltage Vin being connected to this same node 1 via the switches 2. Connected in series to the nodes 1 are the capacitors 4, the inverters 5 whose terminals can be connected via a switch 6, and the nodes 7. Next, and still in series, the capacitors 8 connected in series to the inverters 9 whose terminals can be connected by the switches 10, and finally the outputs 13.

This type of comparator, called an auto-zeroing comparator, enables the inverters to be temporarily polarized in their gain zones (close to Vdd/2). This auto-zeroing function is assured by closing the switches 6 and 10 (by internal sequencing) of the inverter devices 5 and 9. By having two auto-zeroing devices in series per comparator we can obtain a greater gain gradient, which enables finer comparisons since the inverter is in an unstable situation and is very sensitive to the difference Vref−Vin. In a common sequencing, the switches 6 and 10 of the auto-zeroing devices are opened and closed simultaneously, this being justified by the dynamic performance that we wish to obtain.

The improvement compared with a prior-art flash converter consists in replacing the comparator j by a half-comparator j constituted by two capacitors 11 in series linking the nodes 7 of the adjacent comparators and whose capacity C/2 is half of the value C of the capacitors 8. At the node 12 between these two capacitors 11, an auto-zeroing device of the same type as those of the adjacent comparators is connected to the output 13 via an inverter 9 whose terminals can be connected via a switch 10. The capacitive divider bridge formed by the capacitors 11 of capacity C/2 gives the value of the voltage to compare for the median comparator (half-comparator j). In this device, the interpolation factor is 2, but it can be increased to 4 or 8. By reducing the number of stages, we reduce the power consumption and the surface area.

The major disadvantage of this structure is related to the fact that we overcharge the previous gain stage and therefore that we diminish significantly the maximum operating frequency for a given consumption. The immediate effect of this is to limit the speed of the device. In effect, parasitic capacities associated with the "useful" capacities are far from negligible: they are typically of the order of 0.8×C.

SUMMARY OF THE INVENTION

The present invention overcomes these disadvantages by applying a principle that is not linked to a capacity ratio to make the interpolation. Furthermore, the charge seen by the previous gain stage remains low and enables the operating frequency to be increased without increasing the consumption.

A first embodiment of the present invention consists of an auto-zeroing comparator with two analog input voltages Vref and Vin to be compared, including a first stage constituted by a capacitor that charges these voltages via two switches, and a first inverter whose terminals can be connected via a switch providing the auto-zeroing function. The main originality of the invention is that this comparator includes a second stage constituted by:

- an inverter function provided in such a way that only a first transistor is controlled on its gate by the previous stage;
- a second transistor having its gate and drain short-circuited by a switch during the auto-zeroing phase;
- and a third transistor used as a capacitor and connected to the gate of said second transistor and also to the supply voltage.

The present invention also concerns a multi-comparison interpolation comparator including a certain number n of the comparators described above, and, insert between two of these comparators i and k, a median comparator j including only a second stage connected to the two outputs of the first stages of the adjacent comparators i and k, this stage including the following components:

- two first transistors whose gates are controlled respectively by the outputs of the first stages of the adjacent comparators (i, k);
- two second transistors connected whose gates receive the auto-zeroing voltage during the corresponding phase, these first and second transistors performing the inverter function;
- two third transistors whose sources and drains are connected to the supply voltage (Vdd) and whose gates are connected to the gates of the second transistors, performing the capacity function;
- a switch connecting the output of the stage to the gates of the four second and third transistors;
- and an output (j) of this comparator providing the voltage at this node.

Despite the many advantages of this first embodiment of the invention, one disadvantage remains the extra cost related to the structure of the comparator that remains conducting during the comparison phase. A second embodiment of the invention enables the consumption of this type of comparator to be reduced without degrading the dynamic performance, by using non-simultaneous sequencing of the auto-zeroing devices.

In this second embodiment of the present invention consists in adding an extra switch is added to the second stage of the comparator connecting the gates of the second and third transistors to the supply voltage. The sequencing of the switches is adapted to enable consumption to be reduced.

The present invention also includes an interpolation ADC using comparators according to this second embodiment of the invention.

The present invention is applicable preferably to an ADC CMOS a comparisons multiples using at least one "auto-zeroing" comparators.

BRIEF DESCRIPTION OF THE DRAWINGS

The invention will be better understood and other advantages will become clear on reading the following description making reference to the appended figures, of which:

FIG. 3b shows the sequencing of the switch of the comparator in FIG. 3a.

Figure 1:
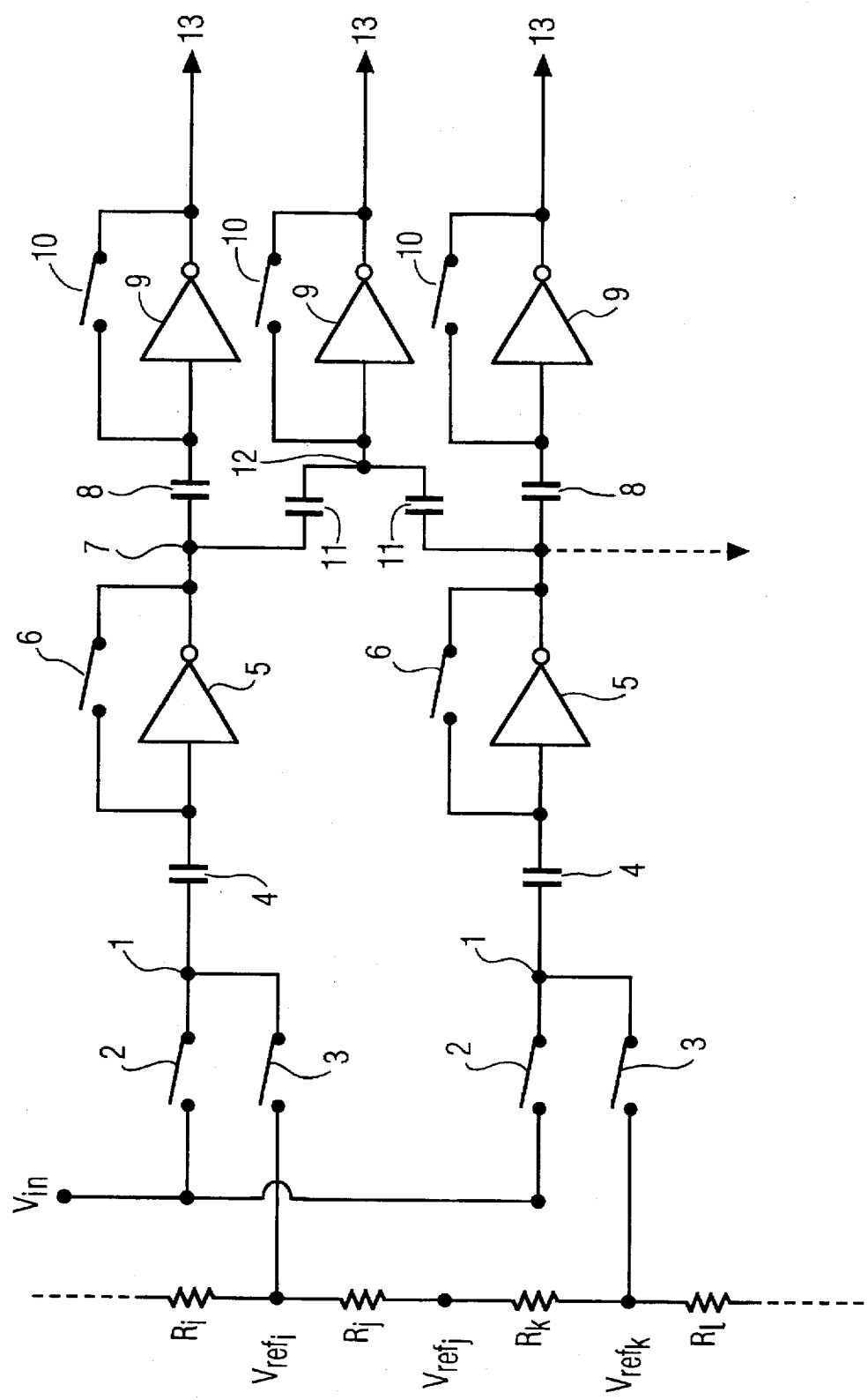
FIG. 1, described above, shows part of a multiple-input comparator used in a prior-art converter.
Figure 2A:
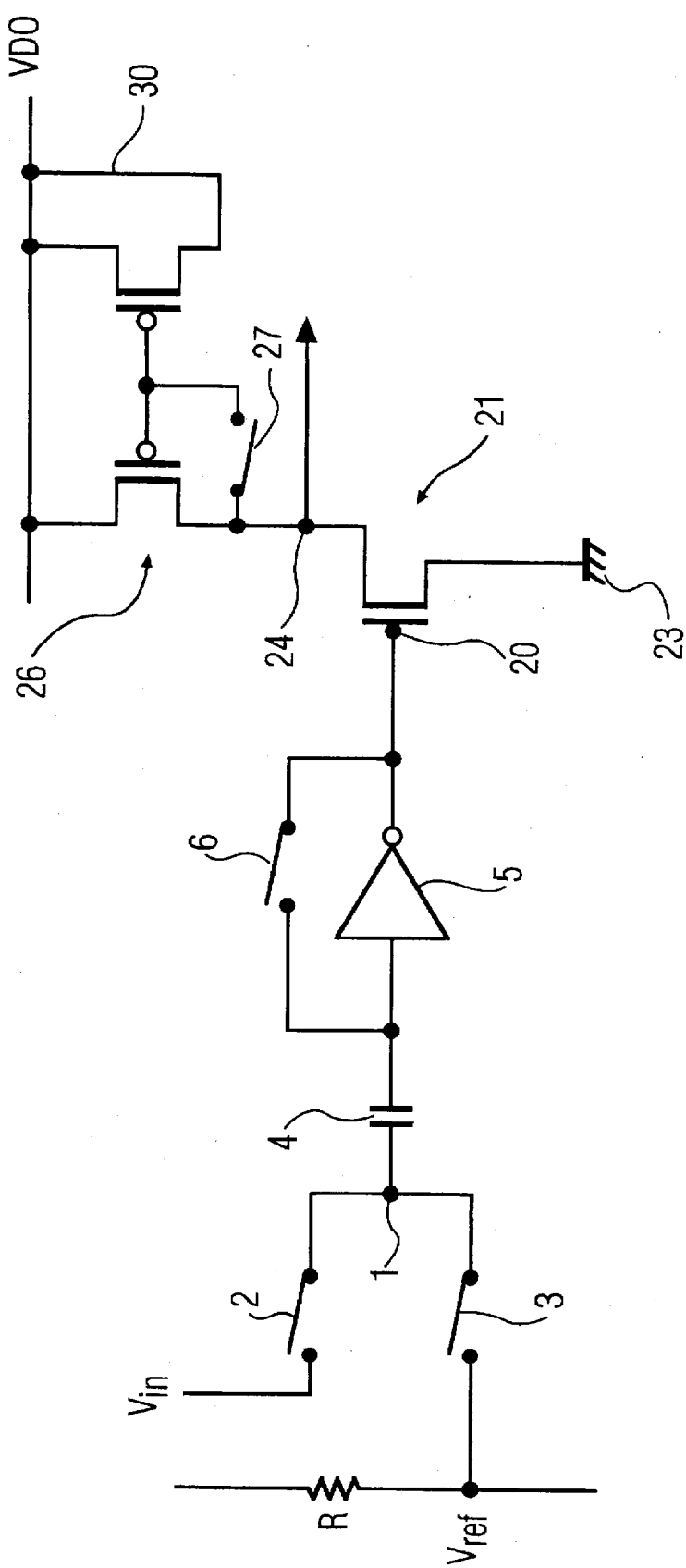
FIG. 2a shows a comparator according to a first embodiment of the invention.

The comparator according to the invention of FIG. 2a includes a first stage equivalent to that of known comparators as described in FIG. 1 (the references designating the same parts are the same in both figures). The voltages Vin and Vref to be compared are both connected to the nodes 1 via the switches 2 and 3 connected in series to a capacitor 4, an inverter 5 whose terminals can be connected via a switch 6 performing the auto-zeroing function. An important characteristic of the present invention is that this first stage controls the gate 20 of a first transistor 21, preferably of nMOS type, the source being connected to the ground 23 and the drain to a node 24. This node 24 is connected both to the drain of a second transistor 26, and to the gate of this same transistor 26, preferably of pMOS type, via a switch 27. The gate of the transistor 26 is connected to the gate of a third transistor 30. The source of the second transistor 26 and the sources and drains of the third transistor 30, which behaves like a capacitor, are connected to the supply voltage Vdd. The output of this comparator is taken from the node 24.

In this second stage of the comparator, the nMOS and pMOS transistors 21 and 26 also form an inverter stage, the auto-zeroing function being performed by closing the switch 27 connecting the gate and the drain of the transistor 26. During the same phase, a capacitor 30 of low capacitance C is charged to the auto-zeroing voltage, i.e. the equilibrium polarisation of the inverter constituted by the transistors 21 and 26, that will be maintained until the moment of the comparison. During the comparison phase, the switches 6 and 27 are obviously open, and the MOS transistors 21 and 26 behave simply like a gain stage. The advantages of this type of stages are that the value C of the capacity 30 can be very low (of the order of that of the gate of a MOS) and therefore the response speed can be very high. The relative precision of these capacities between comparators is not critical, and finally, the charge on the first stage is five to ten times lower than in the classic structure described in FIG. 1.

Figure 2B:
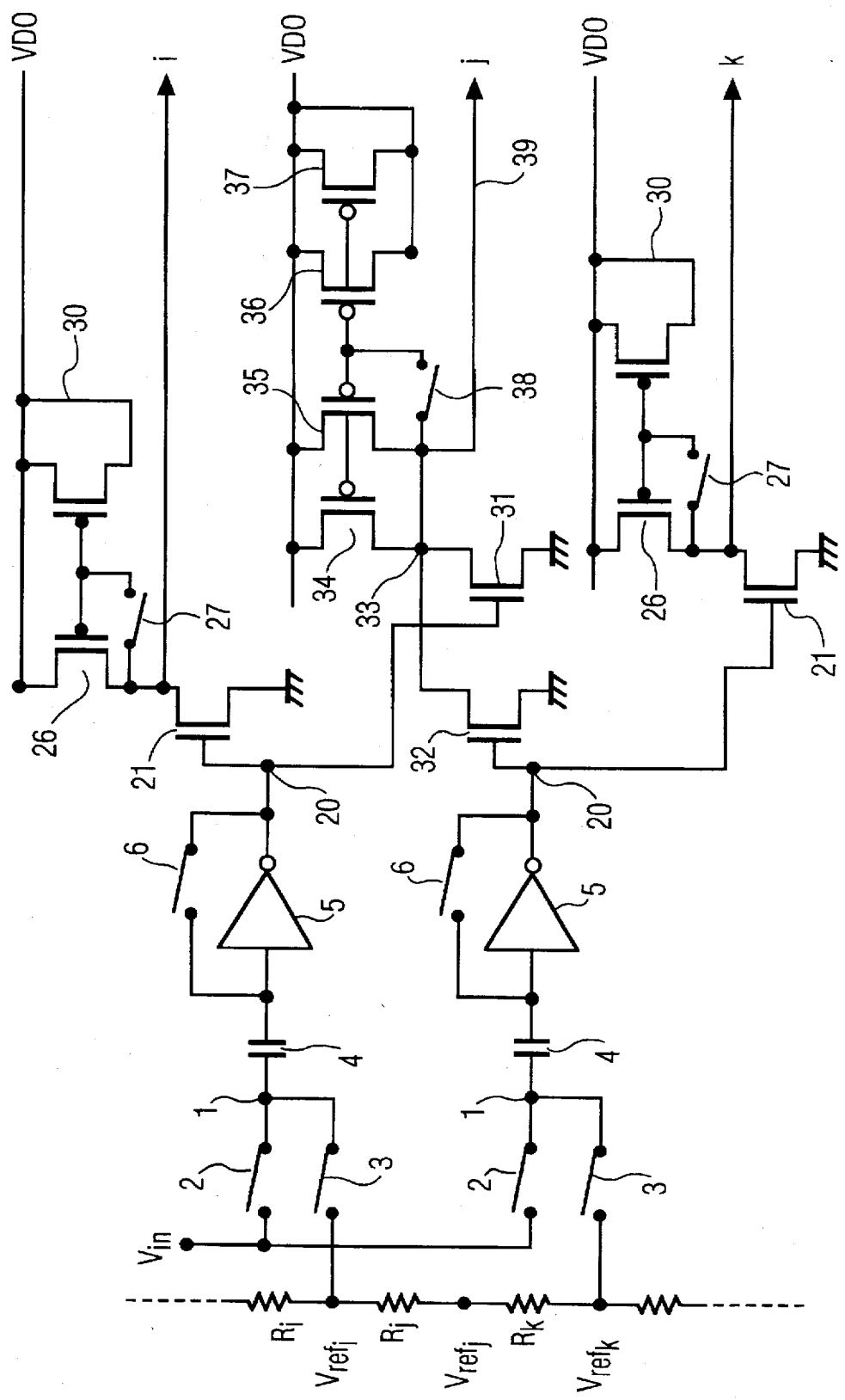
FIG. 2b shows a CMOS ADC according to this first embodiment of the invention.

FIG. 2b shows the application of this comparator according to the first embodiment of the invention to a multiple comparator, for example an n-stage comparator. The adaptation of the device of FIG. 2a to an interpolation system consists in duplicating the second stage of the comparator of FIG. 2.

In FIG. 2b we find the comparators i and k as they were described in FIG. 2a. However, the median comparator j is duplicated relative to that of FIG. 2a: the nodes 20 of the adjacent comparators i and k control respectively the first transistors 31 and 32 whose sources are connected to ground, these forming the first part of the inverter of the median comparator j. The drains of these first transistors are connected to the node 33. Second transistors 34 and 35, duplicated relative to those of the adjacent stages i and j, are connected in parallel on one side to this node 33 and on the other to the supply voltage Vdd. They constitute the second half of the inverter of the median comparator j.

Third transistors 36 and 37, also duplicated with respect to the equivalent assembly of the adjacent stages, have their sources and drains connected to the supply voltage Vdd, and constitute the capacity charged to the equilibrium polarisation of the inverter of the median comparator j.

A switch 38 connects the node 33 to the gates of the transistors 34, 35, 36 and 37.

Finally, the output of the comparator j towards an intermediate stage is taken from the node 33.

The averaging of the upper and lower values of the adjacent stages is in this case of gain type instead of being of capacitive type as in the prior art, by the control of the gates of the MOS transistors 31 and 32.

The main advantage of this solution is to bring to the output of the first stages a minimum charge and therefore to increase the operating speed. In addition, it reduces the overall size, since the solution of the prior art (capacity) is comparatively larger.

Figure 3A:
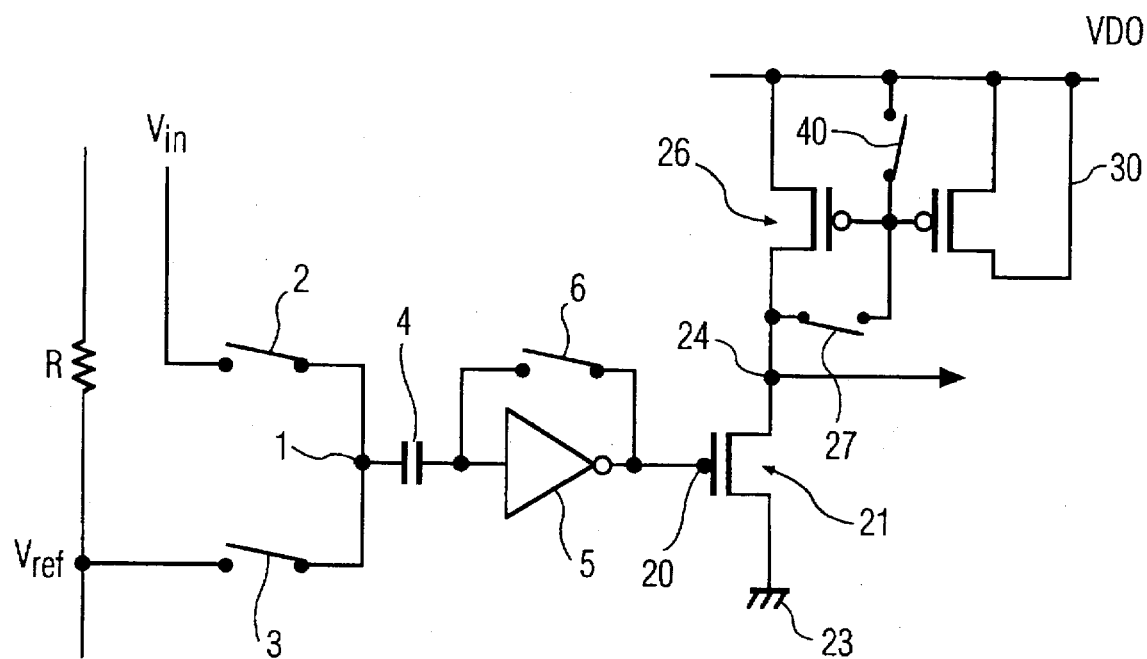
FIG. 3a shows a comparator according to a second embodiment of the invention.

FIG. 3a shows a second embodiment of the invention which enables further reduction of the consumption of a comparator without degrading its dynamic performance. The structure of the comparator according to this second embodiment of the invention is almost identical to that of the first embodiment of the invention of FIG. 2a, with a switch 40 connecting the gates of transistors 26 and 30 to the supply voltage Vdd. We have seen earlier in FIG. 2a that the auto-zeroing function of the second stage is performed by closing the switch 27. This auto-zeroing is very rapid since the capacity 30 that must memorize the voltage on the gate of the transistor 26 can be of low value. The advantage of this system is that it always remains well polarized by the transistor 26, even when we deviate from the equilibrium polarisation of the auto-zeroing (speed of reaction).

Figure 3B:
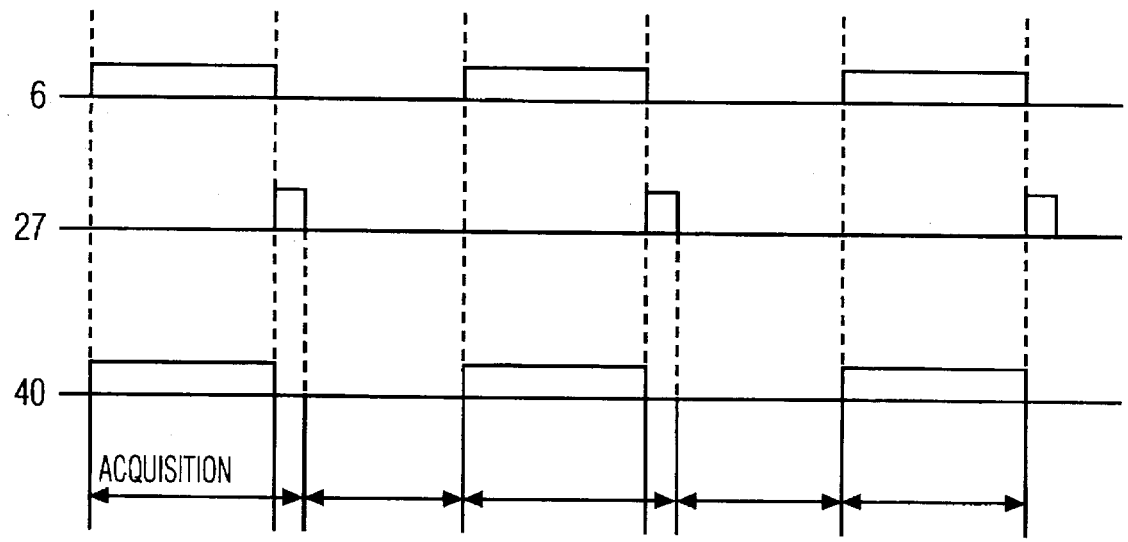

Compared with the first embodiment of the invention in FIG. 2a, the second embodiment implements the following sequencing illustrated in FIG. 3b: during the auto-zeroing phase of the first stage (acquisition phase), switch 6 is closed, 27 is open and 40 closes in order to cut off the consumption of the second stage. Just before the comparison, switch 40 is open and 27 closes simultaneously and rapidly in order to carry out the auto-zeroing function of the second stage. Just before the comparison phase, switches 6 and 27 are open.

For the fine comparison phase in a half-flash converter, this enables the consumption of the second stage to be cut off during alternate periods.

This type of comparator can be used in a multi-comparison interpolation ADC in the same way as the first embodiment of the invention in FIG. 2b; it is only necessary to add to the structure of FIG. 2b switches 40 connecting the gates of transistors 26 and 30 to the supply voltage and, in the median stages, to add a switch connecting the gates of transistors 34, 35, 36 and 37 to this same supply.

All the transistors and switches mentioned in the description of the invention in FIGS. 2a, 2b, 3a and 3b are preferably MOS transistors.

The present invention is applicable in particular to all types of CMOS multi-comparison ADCs using at least one "auto-zeroing" comparator.

What is claimed is:

1. Multi-comparison interpolation comparator comprising:

at least two auto-zeroing comparators, each auto-zero comparator including a first stage comprising a capacitor coupled through a first switch to a reference voltage, and coupled through a second switch to a voltage to be compared to said reference voltage, said capacitor being coupled to a first inverter whose terminals are connected through a third switch, said first Inverter being coupled to a second stage comprising a second autozeroed inverter and a median comparator comprising only a second stage connected to the outputs of the inverters of the first stages of two adjacent auto-zeroing comparators, said second stage of said median comparator comprising:

a first pair of transistors, the gates of which are controlled respectively by the outputs of the first inverters of the adjacent auto-zeroing comparators;

a second pair of transistors which combined with the first pair of transistors perform the function of an inverter;

a third pair of transistors whose sources and drains are connected to the supply voltage in order to perform the function of a capacitor, the gates of said third pair of transistors being connected to the gates of said second pair of transistors;

a switch connecting the output of the inverter formed by said first and second pairs of transistors to the gates of the second and third pairs of transistors; and a switch connecting the gates of said second and third pairs of transistors to a supply voltage.

2. Comparator according to claim 1, wherein said transistors are MOS transistors.

3. Auto-zeroing comparator of a first and a second voltage, comprising:

a first stage comprising a capacitor coupled to said first voltage through a first switch and to said second voltage through a second switch, said capacitor being coupled to a first inverter whose terminals may be short-circuited through a third switch, a second stage comprising an inverter function provided in such a way that only a first transistor is controlled on its gate by the previous stage, a second transistor having its gate and drain short-circuited by a fourth switch during an auto-zeroing phase, a third transistor whose source and drain are connected to the supply voltage and whose gate is connected to the gate of said second transistor, and a fifth switch connecting the gates of said second and third transistors to the supply voltage.

4. Comparator according to claim 3, wherein the said first, second and third transistors are MOS transistors.

5. Method of control of the switches in an auto-zeroing comparator according to claim 3 using an acquisition phase and a comparison phase, said method comprising the steps of:

simultaneously closing said third switch of the first stage and of said fifth switch of the second stage, the fourth switch of the second stage being open;

rapid closing of said fourth switch of the second stage and simultaneously opening said fifth switch of said second stage; and opening said third switch of the first stage and said fourth switch of the second stage just before a comparison phase.

* * * * *